United States Patent [19]

Stephens et al.

[11] Patent Number: 4,689,546

[45] Date of Patent: Aug. 25, 1987

[54] INTERNAL ARMATURE CURRENT MONITORING IN LARGE THREE-PHASE GENERATOR

[75] Inventors: Charles M. Stephens, Scotia; Frederick J. Rink, Jr., Schenectady, both of N.Y.

[73] Assignee: General Electric Company, Schenectady, N.Y.

[21] Appl. No.: 810,472

[22] Filed: Dec. 18, 1985

[51] Int. Cl.$^4$ .............................................. H02K 11/00
[52] U.S. Cl. .................................... 322/99; 310/68 R; 310/71; 310/176; 324/158 MG; 324/500
[58] Field of Search ................. 310/176, 68 R, 71, 89, 310/68 C, 91, 90, 52, 57, 64, 65, 168; 336/67, 90, 174, 175, 173, 83; 324/51; 322/99; 324/158 MG; 361/20; 323/355, 358, 359, 361

[56] References Cited

U.S. PATENT DOCUMENTS

| | | | |
|---|---|---|---|
| 2,822,516 | 2/1958 | Raynes | 324/158 MG |
| 3,903,441 | 9/1975 | Towne | 310/71 |
| 3,921,113 | 11/1975 | Schiemann | 336/75 |
| 4,172,984 | 10/1978 | Daugherty et al. | 310/71 |
| 4,410,848 | 10/1983 | Frierdich | 361/20 |
| 4,488,072 | 12/1984 | Archibald et al. | 310/71 |

FOREIGN PATENT DOCUMENTS 1259884  1/1972  United Kingdom ................ 322/99

*Primary Examiner*—R. Skudy
*Attorney, Agent, or Firm*—Jerome C. Squillaro

[57] ABSTRACT

A three-phase generator includes an internal neutral junction to which one end of each of the windings of the generator is connected thereby forming a wye-connected generator. An air-core current transformer is disposed over each of the three conductors leading to the internal neutral junction for monitoring neutral current therein. A corresponding air-core current transformer is disposed over high-voltage terminals connected to the other ends of the generator windings. A shielded differential amplifier on the output of each air-core current transformer produces a signal corresponding to the difference between two bifilar half windings in its associated air-core current transformer. The difference currents from the neutral and high-voltage ends of each generator winding are compared, and, if their difference exceeds a predetermined threshold, a threshold circuit produces a trigger signal which is latched by a latching relay to produce a trip signal for use by the generator control system. Connectors are provided for isolating two of the three generator windings from the internal neutral junction to enable isolated testing of the three windings.

11 Claims, 13 Drawing Figures

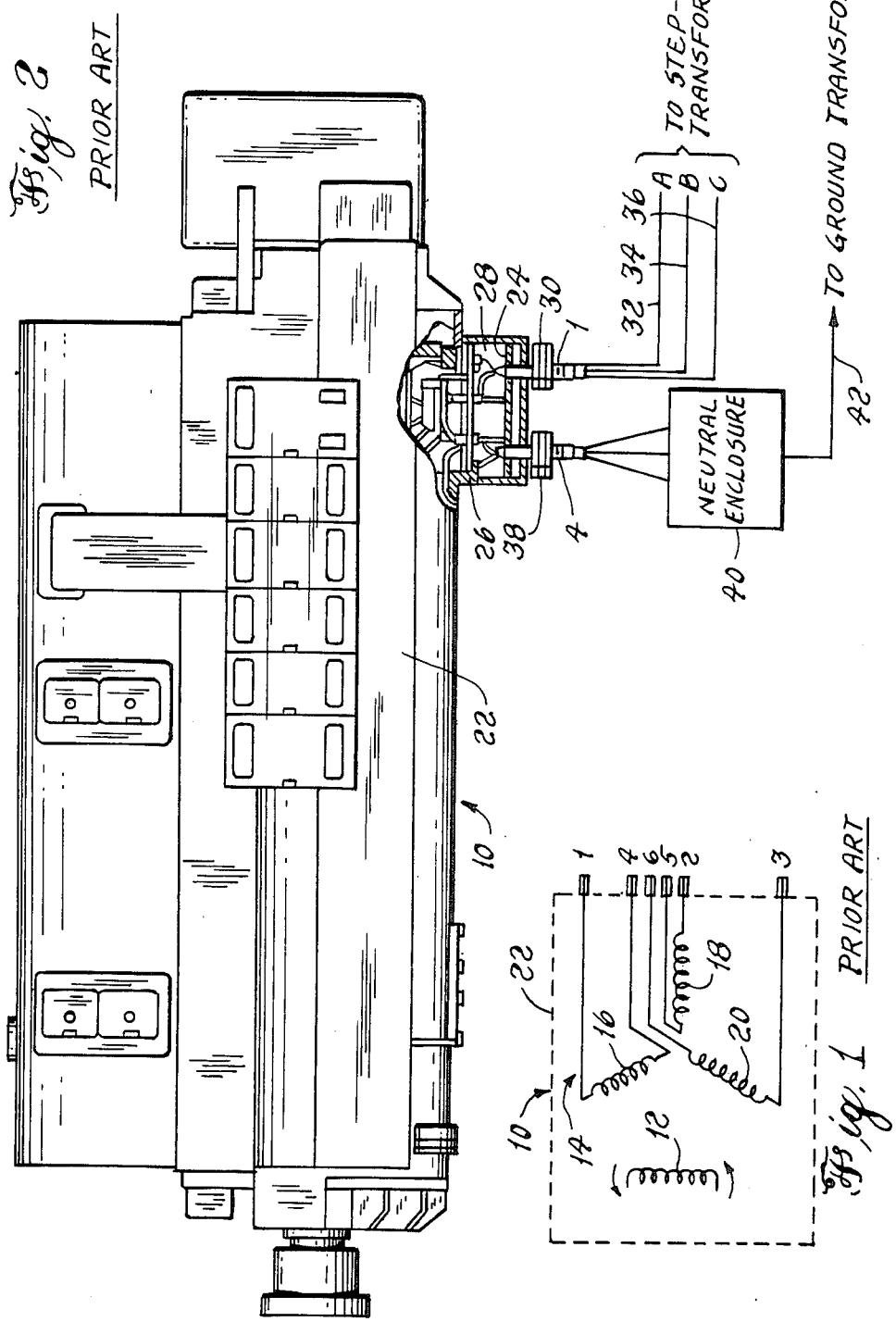

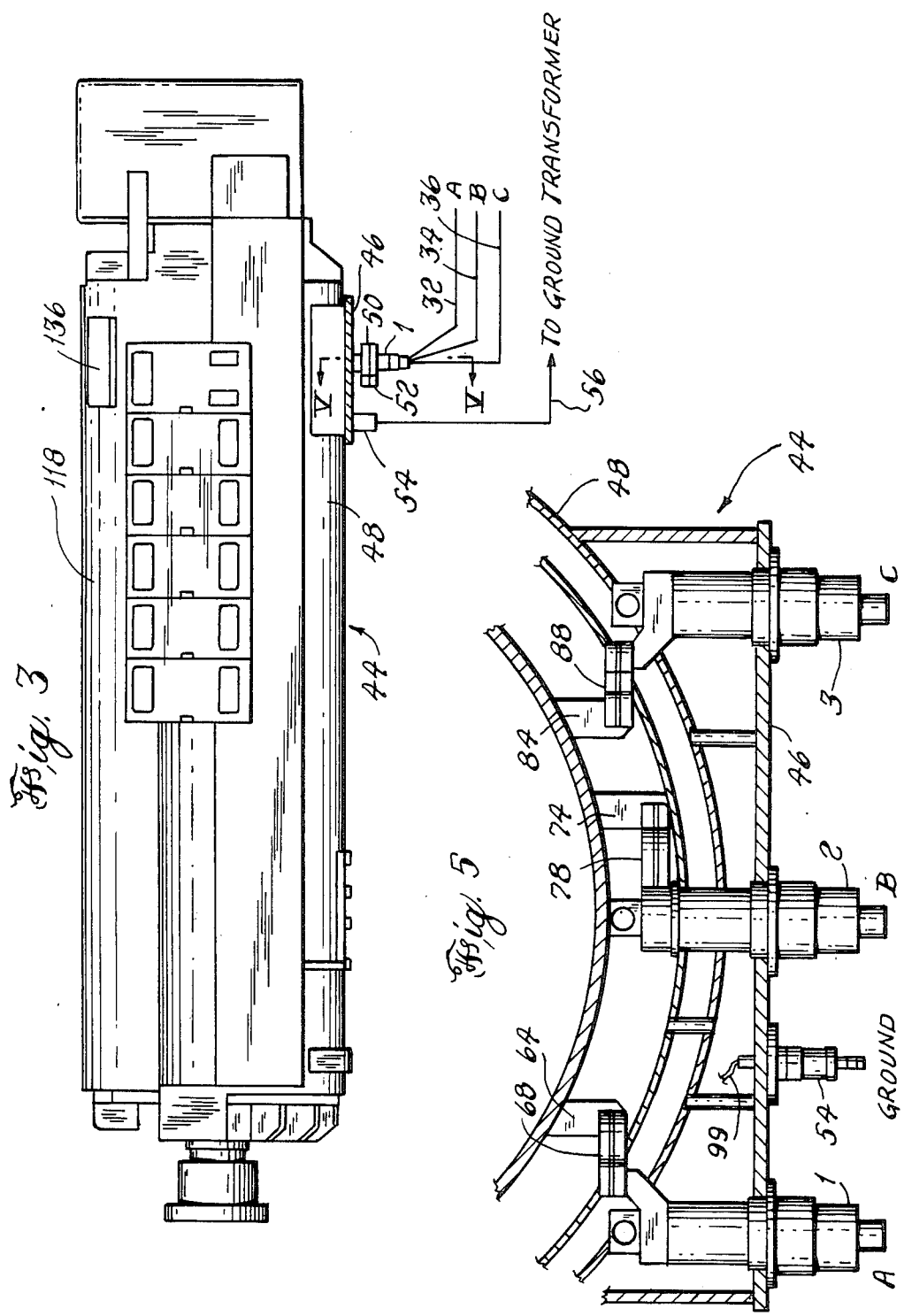

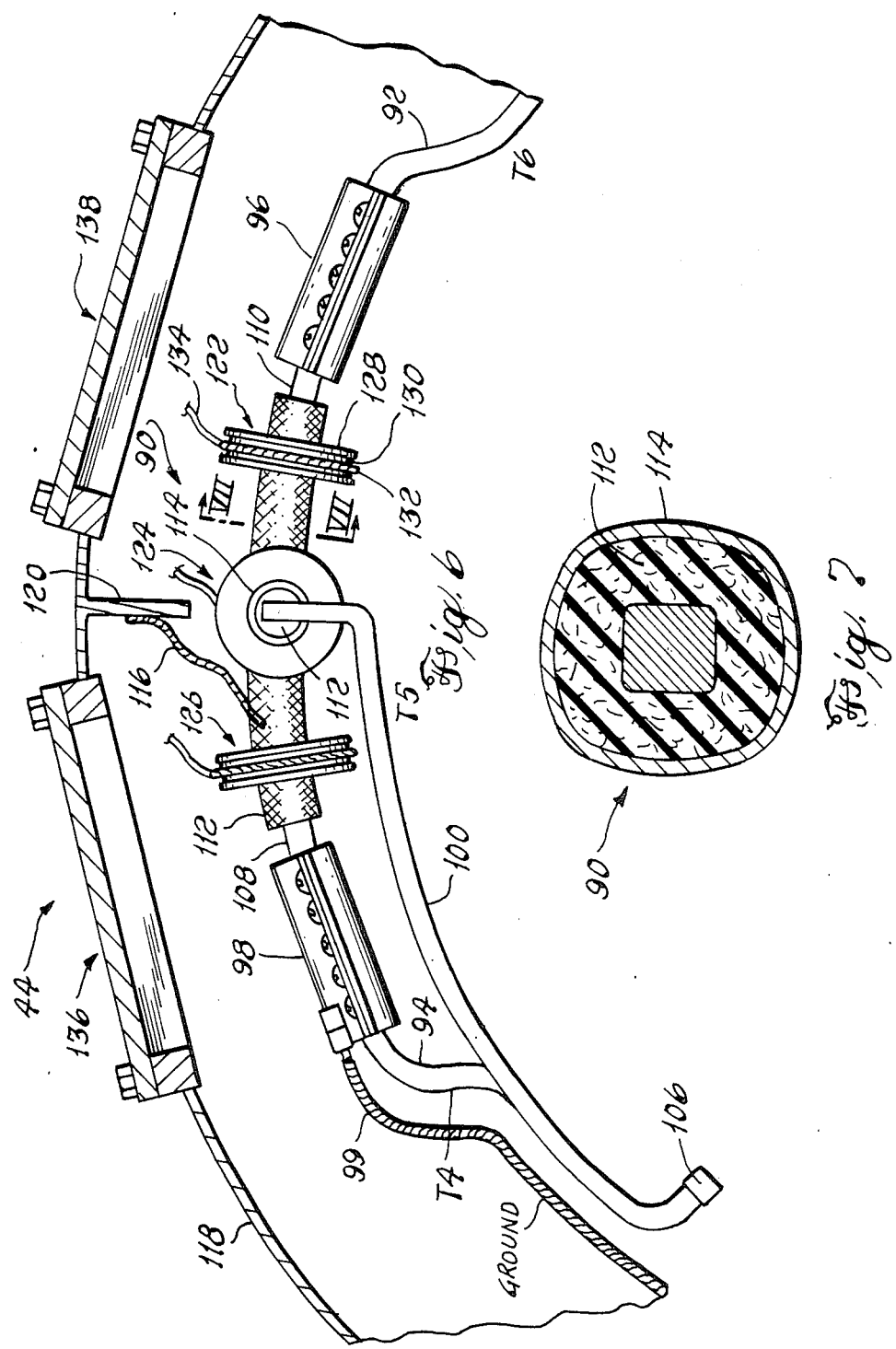

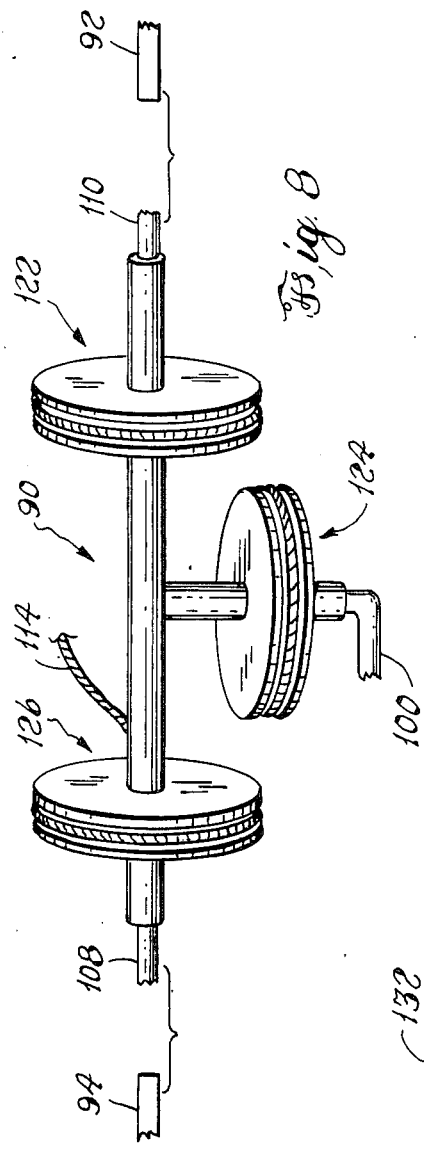
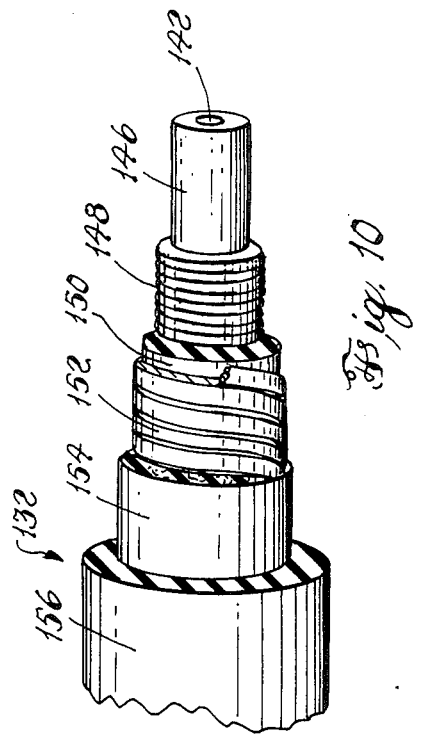
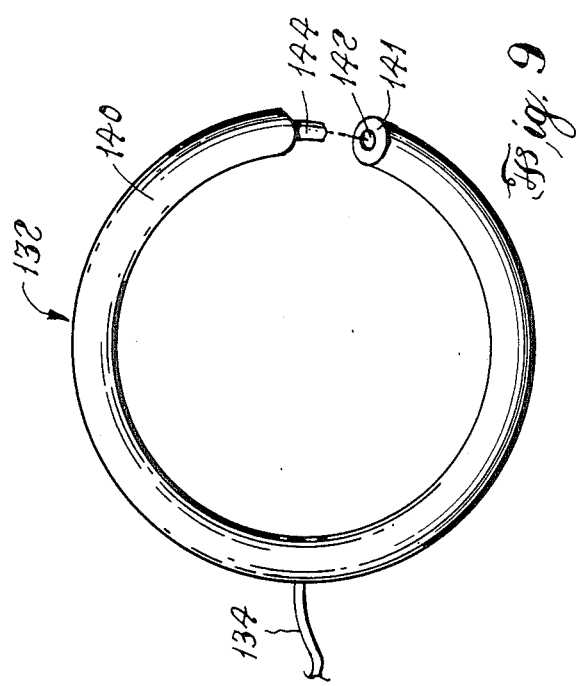

INTERNAL ARMATURE CURRENT MONITORING IN LARGE THREE-PHASE GENERATOR

BACKGROUND OF THE INVENTION

The present invention relates to generators and, more particularly, to apparatus for monitoring current in internal armature connections of a large, three-phase generator.

Although the present invention may have applicability to other types of generators, for purposes of concreteness of description, the following disclosure is directed toward a two-pole, three-phase generator.

A large two-pole, three-phase generator conventionally includes a laminated stator having longitudinal slots into which conducting bars are installed. The ends of the conducting bars are interconnected by end turns to produce three stator windings whose centers are physically and electrically spaced apart by about 120 degrees. Each of the three stator windings is made up of two phase belts which may be connected in series or parallel to form windings referred to as 1-circuit or 2-circuit windings respectively. Both ends of each winding are brought out of the generator stator frame to terminals for connection to external circuits. Each of the six terminals is encircled by one or more large, iron-core, current transformers for detecting problems in the stator or its load.

External connection of the terminals may be arranged to produce either a wye-connected or a delta-connected generator. In practice, however, the delta connection is rarely used for utility power generation. A wye connection is conveniently formed by placing a short-circuit jumper across the appropriate end of each of the windings as dictated by the desired phase relationships therebetween. This shorted end of each winding provides a neutral point at which the windings can be grounded. It is thus conventional to identify the three terminals which are to be jumpered together and grounded as the neutral terminals. The remaining three terminals are conventionally called the high-voltage terminals.

Certain test operations such as, for example, periodic high-voltage testing of individual windings, require that provision be made for isolating each phase by removing the jumper connecting the neutral ends of the three windings.

A substantial amount of space is required for mounting the three high-voltage terminals and the three neutral terminals, and for accommodating the internal connections. The six terminals must be spaced apart sufficiently to accommodate the large physical size of conventional iron core current transformers provided on each terminal for measuring the current in the respective windings. To satisfy the internal and external space requirements for connection and interference avoidance, it is conventional to provide a large lower frame extension which extends below the envelope of the generator stator frame.

The maximum permissible envelope size of a generator is established by clearance requirements of curves, bridges and tunnels between the point of manufacture and the point of installation. If the lower frame extension is integrally installed during manufacture of the generator, both the generator envelope dimension and its generating capacity would be reduced. It is thus conventional to ship the lower frame extension separately from the generator and install it at the destination.

A lower frame extension is a large, expensive structure weighing, for example, several tons. Its on-site installation adds significantly to the labor to place a generator in operation. The elimination of the lower frame extension is thus desirable.

The neutral terminals are shorted together in a neutral enclosure external to the generator stator frame. Such a neutral enclosure may be a stainless steel box as large as about four feet by four feet by eight feet. Both the neutral terminals, and their associated enclosure, are expensive and their elimination is also desirable.

Some generators have been built in which the neutral terminals, and their iron core current transformers, have been moved from the lower frame extension to positions within the generator wrapper. Such a change can only be performed when sufficient internal space within the generator wrapper is available for containing the connections and current transformers sufficiently spaced apart to avoid mutual interference. This is not feasible in most generator designs.

OBJECTS AND SUMMARY OF THE INVENTION

Accordingly, it is an object of the invention to provide a wye-connected generator in which external neutral terminals are not required.

It is a further object of the invention to provide a generator in which neutral current in each winding is monitored using an air core current transformer.

It is a still further object of the invention to provide a three-phase, wye-connected generator having internal current monitoring in which a separately installed lower frame extension is replaced by a permanently installed terminal plate.

It is a still further object of the invention to provide a three-phase, wye-connected generator having an internal neutral point in which the neutral connections from each of the generator windings may be disconnected for isolating the individual windings.

It is a still further object of the invention to provide a three-phase generator having multi-circuit stator windings in which the current in each circuit of each winding is monitored using an air-core current transformer.

Briefly stated, the present invention provides a three-phase generator having an internal neutral junction to which one end of each of the windings of the generator is connected thereby forming a wye-connected generator. An air-core current transformer is disposed over each of the three conductors leading to the internal neutral junction for monitoring neutral current therein. A corresponding air-core current transformer is disposed over high-voltage terminals connected to the other ends of the generator windings. A shielded differential amplifier on the output of each air-core current transformer produces a signal corresponding to the difference between two bifilar half windings in its associated air-core current transformer. The difference currents from the neutral and high-voltage ends of each generator winding are compared, and, if their difference exceeds a predetermined threshold, a threshold circuit produces a trigger signal which is latched by a latching relay to produce a trip signal for generator protection. Connectors are provided for isolating two of the three generator windings from the internal neutral junction to enable isolated testing of the three windings. Multi-circuit stators have an air-core current transformer disposed about a conducting part of each circuit.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 1 is a simplified schematic diagram of a three-phase generator of the prior art.

FIG. 2 is a side view of a three-phase generator of the prior art, with portions partly cut away to reveal internal elements of interest to the description.

FIG. 3 is a side view of a three-phase generator according to an embodiment of the invention.

FIG. 5 is a cross section taken along V—V in FIG. 3.

FIG. 6 is a view taken in direction VI—VI in FIG. 4.

FIG. 7 is a cross section taken along VII—VII in FIG. 6.

FIG. 8 is a view of the neutral junction of FIG. 6 rotated 90 degrees and with its clamp-type connectors removed to isolate the generator windings.

FIG. 9 is a side view of an air core current transformer according to an embodiment of the invention.

FIG. 10 is a perspective view of a portion of the air core current transformer of FIG. 9 with individual layers peeled back to reveal internal elements.

DETAILED DESCRIPTION OF THE PREFERRED EMBODIMENT

Figure 4:
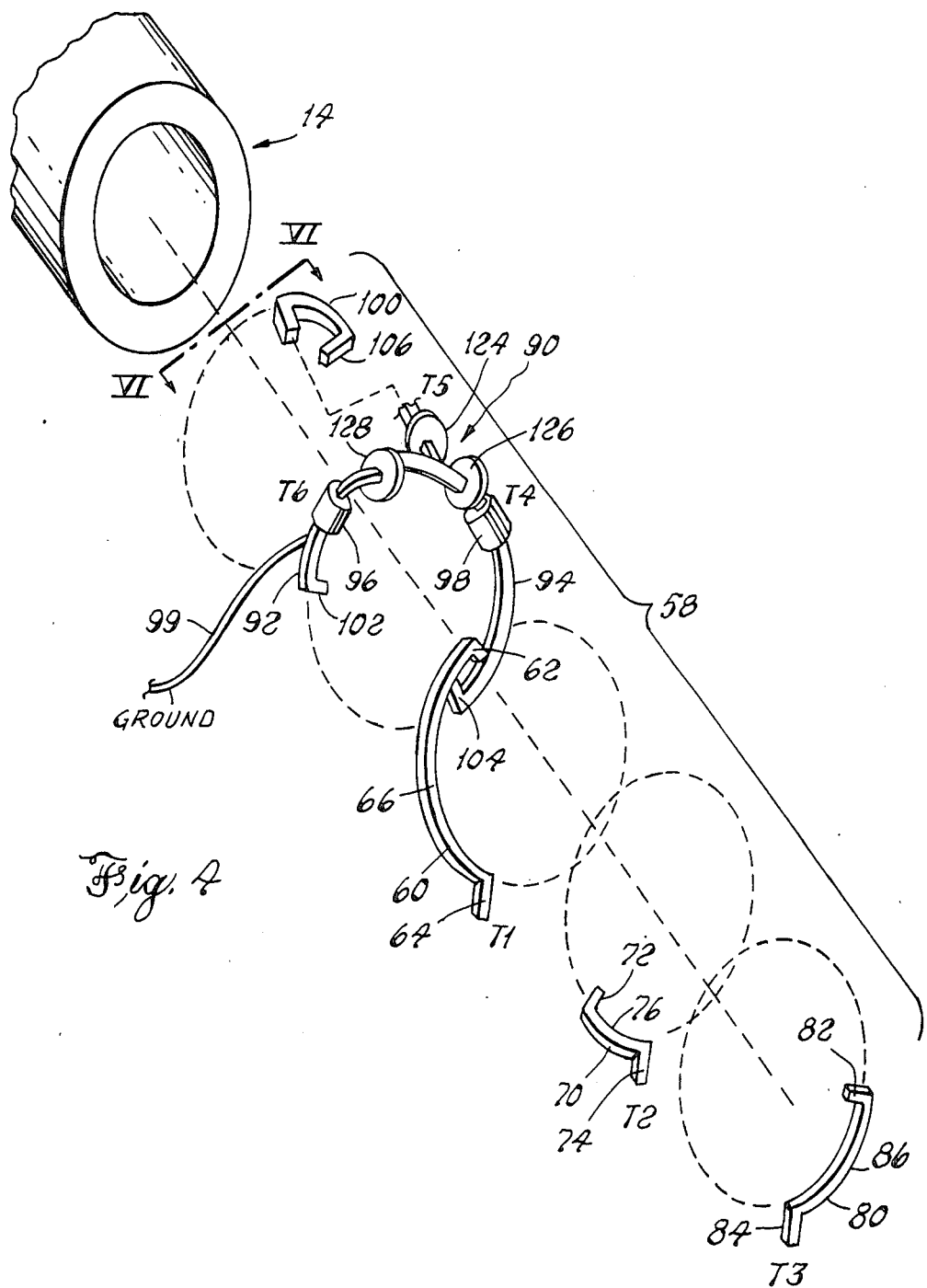
FIG. 4 is a perspective view of a portion of an armature and connection rings of a single circuit armature for the generator of FIG. 3.

Referring to FIG. 1, there is shown, generally at 10, a three-phase generator to which reference will be made in describing the prior art. A field winding 12, which is energized by a source of direct current (not shown), rotates within an armature 14 containing a set of three armature windings 16, 18 and 20. Each of armature windings 16, 18 and 20 consists of two or more individual phase belts connected in series or parallel. The rotating flux field produced by field winding 12 induces an alternating current in each of armature windings 16, 18 and 20. The foregoing elements are contained in a stator frame 22 (indicated by a dashed line).

The two ends of armature winding 16 are brought out of stator frame 22 on terminals 1 and 4. Similarly, the two ends of armature winding 18 are brought out on terminals 2 and 5; and the two ends of armature winding 20 are brought out on terminals 3 and 6. Wye connection of three-phase generator 10 is accomplished by connecting an external jumper (not shown) between terminals 4, 5 and 6 which are thus called neutral terminals. Terminals 1, 2 and 3 are called high-voltage terminals.

Referring now to FIG. 2, a side view of three-phase generator 10 shows a lower frame extension 24 sealingly affixed to stator frame 22 at a bolted flange 26. An interior 28 of lower frame extension 24 provides space for making electrical and cooling connections from armature 14 (FIG. 1) to terminals 1 through 6 (terminals 2 and 3, and 5 and 6 are hidden behind terminals 1 and 4, respectively). One or more iron core current transformers 30 are disposed about terminal 1, and one or more iron core current transformers 30 are disposed about terminals 2 and 3, for fault detection and for metering current fed to a step-up transformer (not shown) on lines 32, 34 and 36. One or more current transformers 38 are disposed about terminals 4, 5 and 6 for monitoring current therein.

Terminals 4, 5 and 6 are jumpered together within a neutral enclosure 40 attached to the bottom of lower frame extension 24. This configures three-phase generator 10 as a wye-connected generator. A ground lead 42 is connected to ground through a conventional ground transformer (not shown). In this configuration, iron core current transformers 30 monitor high-voltage current in each of terminals 1, 2 and 3, and current transformers 38 monitor neutral current in each of terminals 4, 5 and 6. In the absence of a fault in armature 14, the high-voltage and neutral currents from each winding thereof (FIG. 1) are equal. The current on ground lead 42, after shorting of all neutral terminals in neutral enclosure 40, is very low.

Lower frame extension 24 permits adequate spacing between terminals 1-6. In addition, lower frame extension 24 provides sufficient internal space for making the electrical and cooling connections to terminals 1-6. The internal electrical and cooling connections in three-phase generator 10 are conventional and may be more fully studied by reference to U.S. Pat. No. 4,488,072, the disclosure of which is herein incorporated by reference. Further description of such internal electrical and cooling connections is therefore deemed unnecessary and is omitted herefrom.

If terminals 4, 5 and 6, along with their internal connections, could be removed from the vicinity of terminals 1, 2 and 3, then sufficient space would be available within stator frame 22 for the internal connections to terminals 1, 2 and 3 without the need for lower frame extension 24.

Referring now to FIG. 3, a three-phase generator 44 is shown according to an embodiment of the invention. A permanently installed terminal plate 46 is affixed to the bottom surface of a stator frame 48. A single row of three terminals 1, 2 and 3 (terminals 2 and 3 are hidden behind terminal 1) feeds power on lines 32, 34 and 36 to a conventional step-up transformer (not shown). At least one iron core current transformer 50 may be installed on each of terminals 1, 2 and 3. In addition, an air-core current transformer 52 is also installed on each of terminals 1, 2 and 3. Air-core current transformer 52 will be more fully detailed hereinafter.

The neutral leads for all windings are connected together within stator frame 48. As a result, there is no need to provide three high-current neutral terminals, each with a plurality of iron-core current transformers thereon, as was the case with the prior-art embodiment of FIG. 2. Thus, constraints imposed by the spacing between iron core current transformers 30 and 38 are not operative. As a consequence, satisfactory spacing between iron core current transformers 50 on terminals 1, 2 and 3 is achievable without requiring lower frame extension 24 (FIG. 2).

A low-current ground terminal 54 from the common point of the neutral conductors (not shown) within stator frame 48, is mounted in terminal plate 46. A ground lead 56 is connected from low-current ground terminal 54 to ground through a conventional ground transformer. Since the common neutral point is internal to stator frame 48, only a small current is required to flow through low-current ground terminal 54 and ground lead 56. Consequently, a small low-current ground terminal 54 may be used. Also, since the current in low-current ground terminal 54 is small, and since there are no requirements for current transformers thereon, such current has a negligible effect on the outputs of iron core current transformers 50.

Referring now to FIG. 4, armature 14 is indicated schematically without redundant detail. As previously noted, the present description is directed toward an armature 14 having three windings made up of interconnected conductor bars disposed in slots in its interior. The terminals 1–6, corresponding to those identified in FIG. 1, are identified as T1–T6.

A set of connection rings 58 is disposed at an end of armature 14. The elements making up set of connection rings 58 are exploded for purposes of illustration. In use, such elements are positioned close to each other and close to the end of armature 14. The axial arrangment of the elements of set of connection rings 58 are selected for a particular application. The arrangement shown is exemplary only, and should not be construed as limiting.

A T1 connection ring 60 is disposed in an axially outer location in set of connection rings 58. T1 connection ring 60 includes a connecting portion 62 at a first end thereof connected to a terminal portion 64 at a second end by an arcuate bar 66. Arcuate bar 66 extends over a sufficient arc to position connecting portion 62 at an angular location about armature 14 appropriate for connection to the end of its armature winding (not shown).

Additional connection rings (not shown) are required in armature 14 for connecting the angularly separated phase belts together. Such additional connection rings are conventional and are not considered to be an inventive part of the present invention. Thus, it is considered that inclusion of such additional connection rings would clutter the drawings and obscure the description of the invention. They are therefore omitted from FIG. 4.

Referring now also to FIG. 5, the angular extent of arcuate bar 66 is effective for positioning terminal portion 64 at a convenient location for connection to terminal 1. Any convenient means may be employed for connecting terminal portion 64 to terminal 1 including, for example, one or more domed flexible straps 68 of the type disclosed in the referenced patent.

A T2 connection ring 70 includes a connecting portion 72 and a terminal portion 74 connected together by an arcuate bar 76. Terminal portion 74 is connected to terminal 2 by one or more domed straps 78.

Similarly, a T3 connection ring 80 includes a connecting portion 82, a terminal portion 84 and an arcuate bar 86 each having functions corresponding to those previously described. Terminal portion 84 is connected to terminal 3 by one or more domed straps 88.

In the prior art, connecting rings for neutral terminals 4, 5 and 6 are arranged in a manner similar to T1 connection ring 60, T2 connection ring 70 and T3 connection ring 80 for connection to terminals 4, 5 and 6 (See FIG. 2). The present invention, in contrast, employs a neutral junction 90 for this purpose (FIG. 4). A T6 connection ring 92 and a T4 connection ring 94 are connected to neutral junction 90 by first and second clamp-type connectors 96 and 98, respectively. A T5 connection ring 100 is integrally connected to neutral junction 90. T4 connection ring 92, T6 connection ring 94 and T5 connection ring 100 include terminal portions 102, 104 and 106, respectively, positioned at angles appropriate for making connection to the neutral ends of windings of armature 14.

Referring now to FIG. 6, neutral junction 90 includes a connection stub 108 for connection to T6 connection ring 94 by clamp-type connector 98. Neutral junction 90 further includes a second connection stub 110 for connection to T4 connection ring 92 by clamp-type connector 96.

Referring now also to FIG. 7, an insulating layer 112 is disposed over all of neutral junction 90, except for connection stubs 108 and 110, as well as corresponding portions of T5 connection ring 100. A grounding shield 114 is disposed upon insulating layer 112.

Referring again specifically to FIG. 6, a shield ground lead 116 is connected from grounding shield 114 to a convenient grounding point on a generator wrapper 118 such as, for example, a flange 120. A T6 air-core current transformer assembly 122 is disposed on insulating layer 112 and grounding shield 114 over a portion of neutral junction 90 leading to T6 connection ring 92. In this location, T6 air-core current transformer assembly 122 is operative to monitor neutral current in T6 connection ring 92. Similarly a T5 air-core current transformer assembly 124 is disposed on insulating layer 112 and grounding shield 114 over a portion of neutral junction 90 leading to T5 connection ring 100 and is thus operative to monitor current in T5 connection ring 100. Finally, a T4 air-core current transformer assembly 126 is disposed on insulating layer 112 and grounding shield 114 over a portion of neutral junction 90 leading to T4 connection ring 94 and is thus operative to monitor current in T4 connection ring 94.

T6 air-core current transformer assembly 122, T5 air-core current transformer assembly 124 and T4 air-core current transformer assembly 126 are identical, thus, only T6 air-core current transformer assembly 122 is described in detail. T6 air-core current transformer assembly 122 includes a bobbin 128 having a groove 130 in its outer surface. An annular air core current transformer 132 is disposed in groove 130. A cable 99 for connection to ground terminal 54 may be attached anywhere on the T4-T5-T6 connection ring system, and is here shown connected to clamp-type connector 98. A signal and ground cable 134 is connected from air core current transformer 132 to signal processing equipment to be described hereinafter.

Referring now also to FIG. 8, when clamp-type connector 96 and clamp-type connector 98 are removed, T6 connection ring 92, T4 connection ring 94 and T5 connection ring 100 are electrically isolated from one another to enable the performance of conventional overvoltage, or other, tests on the individual windings. To provide access for such tests, generator wrapper 118 includes first and second manholes 136 and 138 (FIG. 6).

Referring now to FIG. 9, air core current transformer 132 includes a split annulus 140 for enabling installation and removal of air core current transformer 132 without major disassembly of other components. Split annulus 140 includes transverse break 141 having an axial hole 142 at one end thereof and an axial rod 144 at a second end thereof. Axial rod 144 is fittable within axial hole 142 for joining split annulus 140 into a completed torus in groove 130 about bobbin 128 (See FIG. 6).

Referring now to FIG. 10, air core current transformer 132 is a multi-layer structure having a solid or tubular core 146 upon which a winding 148 is disposed. In the preferred embodiment, core 146 is a tube of semirigid plastic, such as Teflon, having axial hole 142 therein. Winding 148 includes, for example, about one thousand turns of enamelled copper wire close-wound on core 146. An insulating and protective layer 150 is disposed atop winding 148. Insulating and protective layer 150 may be, for example, a spiral wrap of a glass fiber tape, but is preferably a shrunk-fit layer of plastic. A metallic shield 152 is disposed upon insulating and protective layer 150. Metallic shield 152 may be in any convenient form, but is preferably an overlapping helical wrap of a metallic foil type having an insulating coating on one of its surfaces. A further insulating and protective layer 154 is disposed atop metallic shield 152. Insulating and protective layer 154 may be, for example, a further layer of glass fiber cloth. Finally, a protective outer cover 156 is disposed on the outside of air core current transformer 132. Protective outer cover 156 is preferably a flexible plastic material such as, for example, Teflon, and is most preferably a convenient one of a commercially available type of plastic tubing which is capable of being shrunk in place using, for example, heat.

Figure 11:
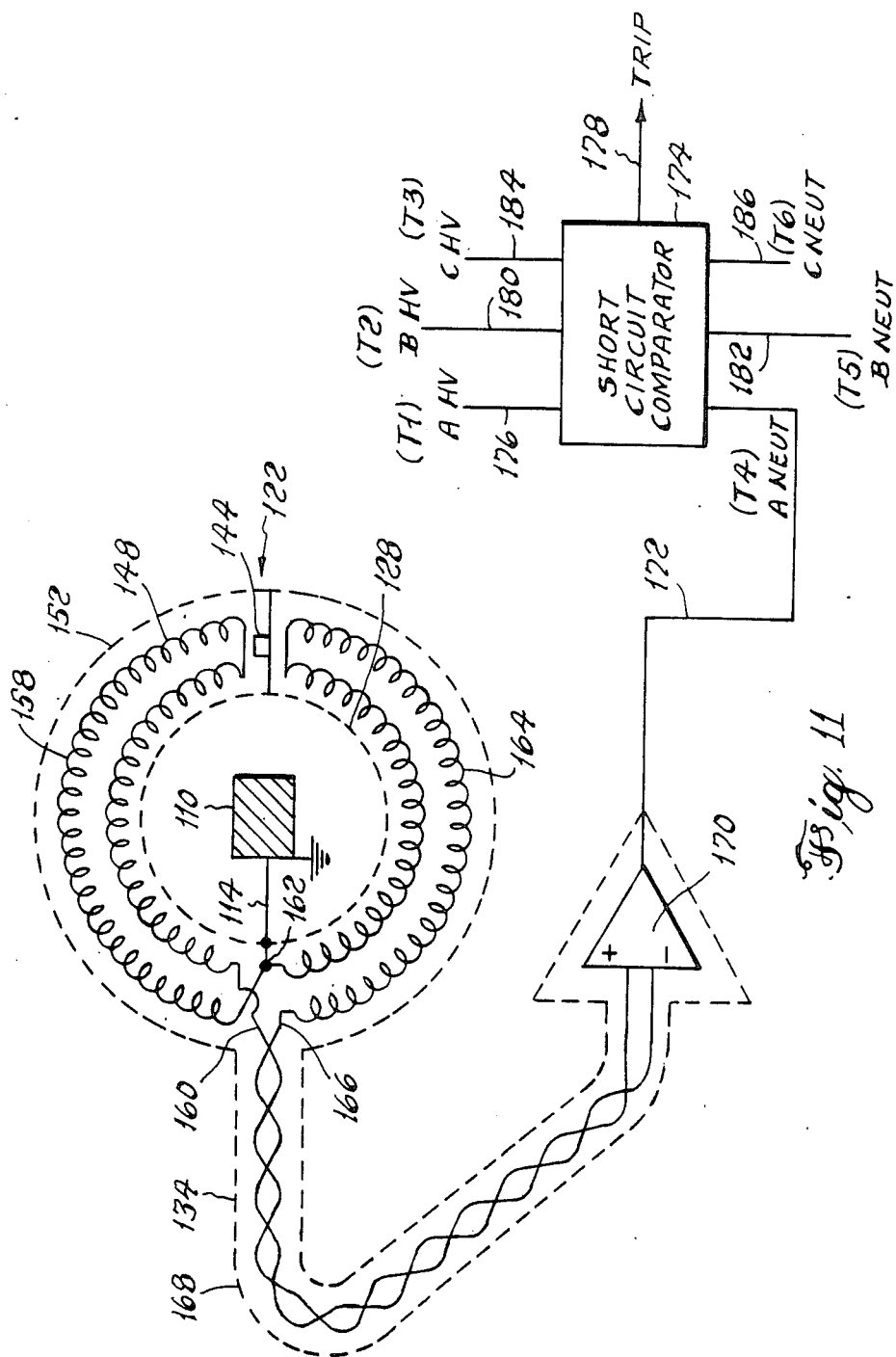
FIG. 11 is a schematic diagram of a T4 air-core current transformer assembly and its associated electronics for monitoring the neutral and high-voltage terminals of a generator for an internal fault.

Referring now to FIG. 11, T6 air-core current transformer assembly 122 (as a representative of all of the air-core current transformer assemblies on all neutral and high-voltage terminals) includes a first bifilar half winding 158 which begins at a signal lead 160 in signal and ground cable 134, and ends at a center tap 162 which is grounded by connection to grounding shield 114 (FIG. 6). T4 air-core current transformer assembly 122 further includes a second bifilar half winding 164 similarly connected between center tap 162 and a second signal lead 166. Metallic shield 152 is grounded by connection to center tap 162 and grounding shield 114. In addition, signal lead 160 and signal lead 166 are shielded by a shield 168 which is also electrically connected to metallic shield 152 and is grounded by connection to center tap 162 and grounding shield 114.

Bifilar half windings 158 and 160 are connected to apply signals of opposite polarity to signal leads 160 and 166. Thus, if a current in connection stub 110 is such that it produces a positive current and voltage in signal lead 160, it also produces a corresponding negative current and voltage in signal lead 166. The signals on signal leads 160 and 166 are applied to inverting and non-inverting inputs of a guarded differential amplifier 170. The guard shield of differential amplifier 170 is connected to cable shield 168 of signal and ground cable 134 for rejecting the influence of electric fields in the proximity of signal and ground cable 134.

Differential amplifier 170 amplifies the difference between the signals on signal leads 160 and 166 but is insensitive to identical changes in the signals on both of these signal leads. Thus, differential amplifier 170 is capable of common-mode rejection while responding fully to real changes in the detected signal. The resulting signal is applied on a line 172 to one input of a short circuit comparator 174.

As previously noted, each high-voltage terminal and each neutral terminal is equipped with an air-core current transformer assembly identical to T4 air-core current transformer assembly 122. In addition, each air-core current transformer assembly feeds its signal to a differential amplifier identical to differential amplifier 170. The resulting current signal from terminal 1, for example, is fed on a line 176 to short circuit comparator 174.

When operating properly, the high-voltage and neutral current from a stator winding should be nearly identical. Thus, a difference between the signals on line 172 and 176 should produce a result which is close to zero. In the event of a serious short in the associated stator winding, the difference between the signals on line 172 and 176 varies significantly from zero to a value exceeding a trip threshold. This difference triggers a trip signal which is applied on a trip line 178 to conventional generator protection circuits for taking three-phase generator 44 off line until the fault is isolated and corrected. Additional signals, not of interest to the present invention, may be generated in response to a current difference. Such additional signals may be employed to protect the turbine driving the generator from loss of load or for producing audible or visual signals to alert an operator.

Similarly, the corresponding current signals on lines 180 and 182, as well as on lines 184 and 186, are applied to short circuit comparator 174 for comparison and the generation of a trip signal if the difference between currents in respective neutral and high voltage terminals exceeds a trip threshold.

Any convenient apparatus may be employed in short circuit comparator 174 for comparing its pairs of inputs. In the preferred embodiment, amplifier circuits (not shown) may be used to generate a signal responsive to the percentage difference between each pair of inputs. One or more conventional threshold circuits may then be provided for determining whether the resulting percentage difference from one or more of the comparisons exceeds the threshold. Upon detection of a percentage difference signal exceeding the threshold, an electronic or electro-mechanical latching circuit (not shown) may be triggered into producing the trip signal on trip line 178 which endures until it is automatically or manually reset.

Figure 12:
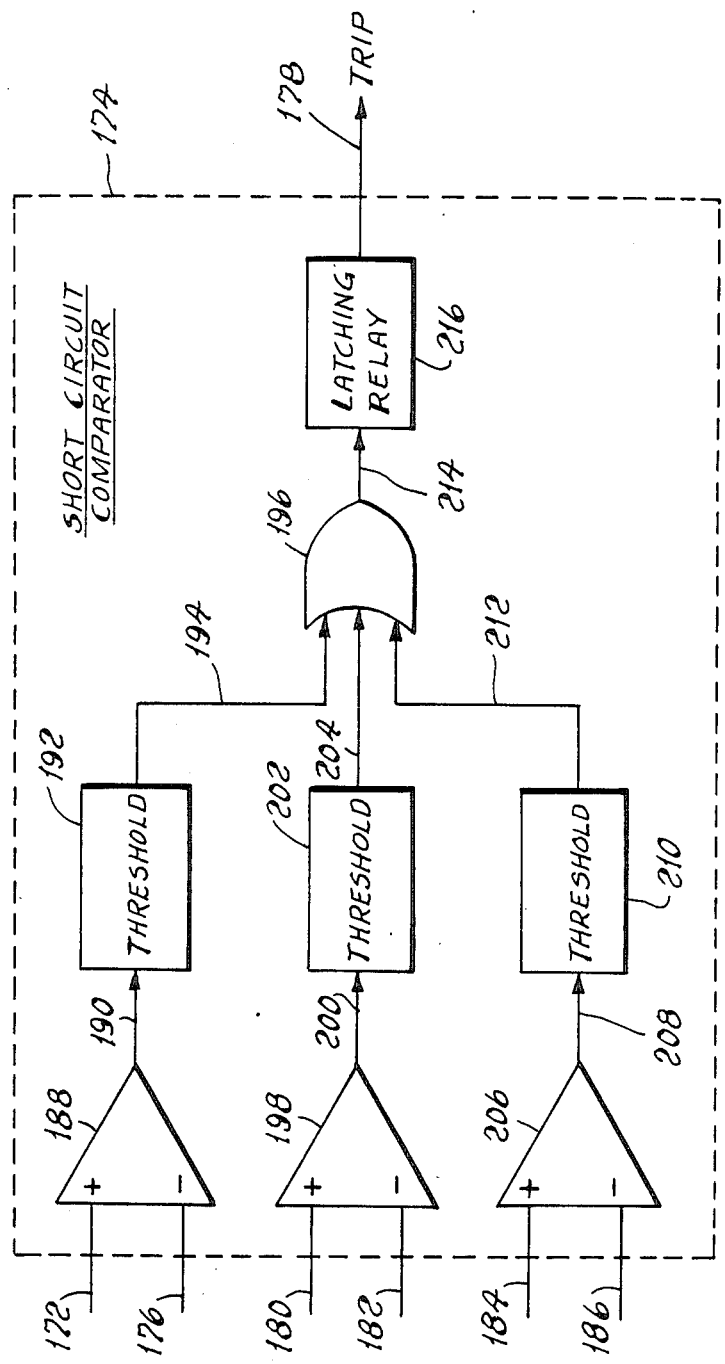
FIG. 12 is a logic diagram of a short circuit comparator of FIG. 11.

Referring now to FIG. 12, short circuit comparator 174 contains a first percentage differential circuit 188 responsive to the percentage difference between signals on lines 172 and 176. A percentage difference signal is applied on a line 190 to a threshold circuit 192. If the percentage difference signal at its input exceeds a predetermined positive or negative value, threshold circuit 192 applies a trigger signal on line 194 to a first input of an OR gate 196.

Similarly, a second percentage differential circuit 198 receives current signals on lines 180 and 182. A percentage difference signal is applied on a line 200 to a threshold circuit 202. When the percentage difference signal applied to threshold circuit 202 exceeds a predetermined positive or negative threshold, threshold circuit 202 applies a trigger signal on a line 204 to a second input of OR gate 196. A third percentage differential circuit 206 monitors the percentage difference between the current signals on lines 184 and 186 and applies a percentage difference signal on a line 208 to a third threshold circuit 210 which is operative to apply a trigger signal on a line 212 to a third input of OR gate 196 when the percentage difference signal exceeds a predetermined positive or negative threshold.

Whenever any one of its inputs receives a trigger signal, OR gate 196 applies the trigger signal on a line 214 to an input of a latching relay 216. Thereupon, latching relay 216 produces a trip signal on trip line 178 which endures until reset, regardless of whether the percentage difference signal giving rise to it later decreases to a value within the predetermined threshold.

The signal output of an air-core current transformer is related to the time derivative of the current passing therethrough. The signals on lines 172, 176, 180, 184 and 186 may first be integrated in conventional integrator circuits (not shown) to derive a signal related to the current passing therethrough before performing additional processing.

Figure 13:
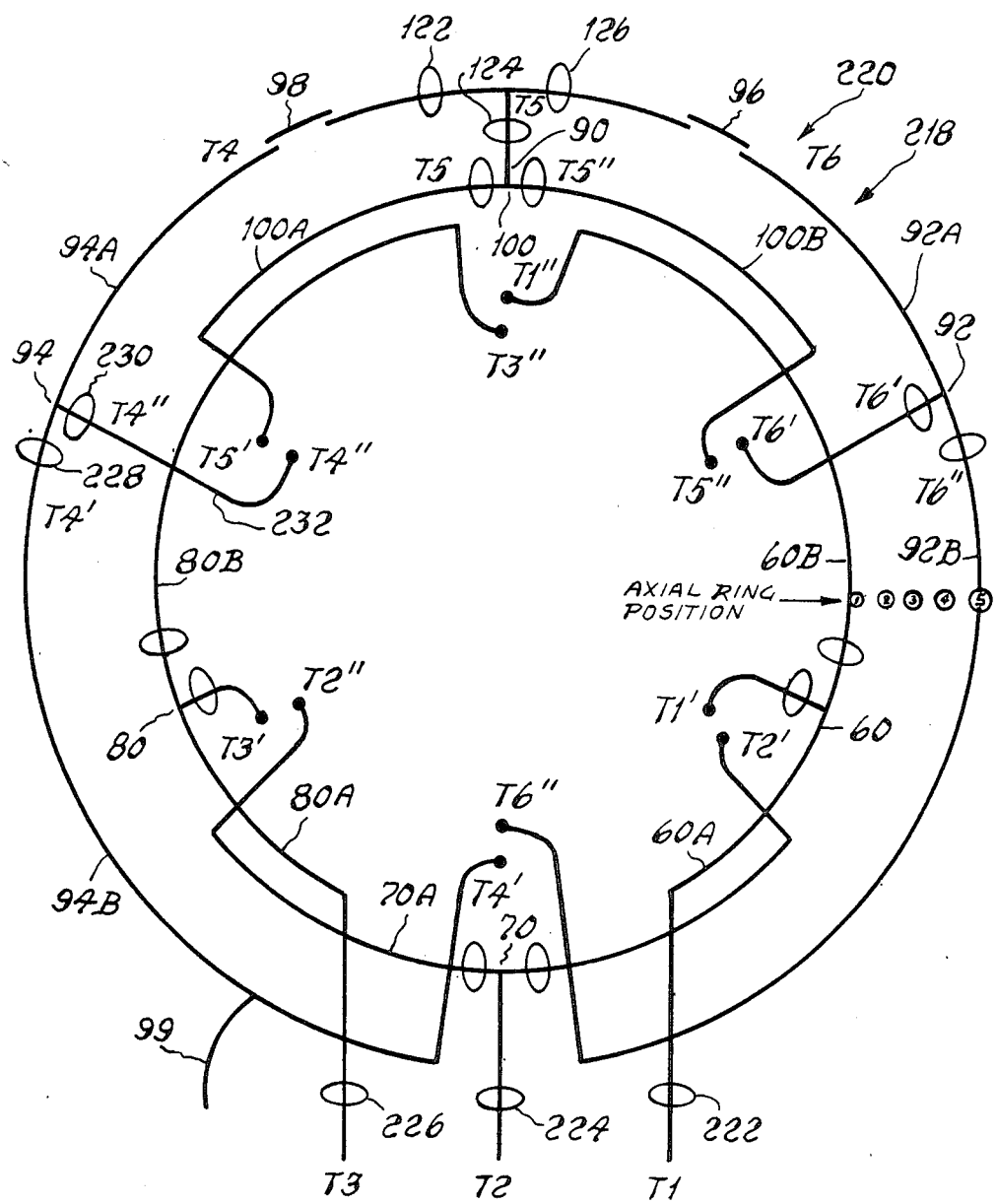
FIG. 13 is a schematic diagram of connection rings of a three-phase stator according to a further embodiment of the invention.

Referring now to FIG. 13, a connection diagram is shown for a three-phase, two-pole armature 218 of a type having two-circuit stator windings. The stator windings themselves are omitted for clarity of presentation. The connection rings are physically disposed at equal radii about an axis of armature 218 and are spaced along the axis. For purposes of illustration, the connection rings are shown at different radii.

A set of connection rings 220 includes elements corresponding to those illustrated in FIG. 4 except that each connecting ring consists of two parts, with the parts having the same reference designators as corresponding elements in FIG. 4 with the addition of suffixes A and B. The two parts of each connection ring enables connection of each connection ring to two angularly spaced-apart windings (not shown). For example, T1 connection ring 60 includes a first half connecting ring 60A between terminal T1 and a connection T1' as well as a second half connecting ring 60B between connection T1' and a connection T1". In the same manner neutral T4 connection ring 94 is divided into a first half connection ring 94A between clamp-type connector 98 and connection T4" and a second half connection ring T4B between connection T4" and connection T4'.

As in the embodiment of FIG. 4, T4, T5 and T6 air-core current transformer assemblies 122, 124 and 126 are provided for measuring the total neutral current in the three phases. T1, T2 and T3 air-core current transformers 222, 224 and 226 respectively are provided for monitoring the total current in high-voltage terminals T1, T2 and T3. The current measurements may be used in the manner previously described.

In normal operation, both of the circuits connected to a connection ring should carry substantially equal currents. A significant departure from such equality may indicate a fault in armature 218 requiring corrective action. The embodiment of the invention in FIG. 13 permits independent monitoring of the current passing to each circuit of armature 218 through the connections shown. For example, the total T4 neutral current in first half connection ring 94A measured by T4 air-core current transformer 122, is made up of the sum of the neutral currents to terminals T4' and T4". An air-core current transformer 228 about first half connection ring 94A encircles only the current of terminal T4'. A second air-core current transformer 230 encircles a stub 232 connected from T4 connection ring to terminal T4" and thus senses only the current passing to terminal T4". Each of the other connection rings is similarly equipped with air-core current transformers positioned to sense the current passing to one of its terminals without being responsive to the current passing to the other of its terminals. These air-core current transformers are preferably of the type illustrated and described hereinabove and are mounted on their respective connection rings or stubs in the manner described.

Due to the small size and weight of air-core current transformers, at least some, and preferably all, of the current measurements for each phase and for each circuit can be accomplished with air core current transformers mounted inside the generator.

It should be noted that, the conventional term for air-core current transformers 52 does not imply a limitation to an air environment. Instead, air-core transformers 52 are of a type using non-magnetic materials in their core. As described above, air-core transformers 52 are supported on nonmagnetic materials and may operate in a gaseous environment other than air such as, for example, hydrogen or helium.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. Apparatus for a three-phase generator comprising:
   a stator;
   at least first, second and third windings in said stator;
   first, second and third high-voltage terminals on an external surface of said generator;
   means for connecting a first end of said first winding to said first high-voltage terminal;
   means for connecting a first end of said second winding to said second high-voltage terminal;
   means for connecting a first end of said third winding to said third high-voltage terminal;
   a neutral junction within said generator;
   first, second and third means for connecting second ends of said first, second and third windings, respectively, to said neutral junction;
   a first air-core current transformer assembly disposed on said neutral junction at a location effective for producing a first current signal in response to a neutral current in said first winding;
   a second air-core current transformer assembly disposed on said neutral junction at a location effective for producing a second current signal in response to a neutral current in said second winding;
   a third air-core current transformer assembly disposed on said neutral junction at a location effective for producing a third current signal in response to a neutral current in said third winding; and
   at least said first and second means for connecting second ends including a removable connector effective, when removed, for electrically isolating said first and second windings from said neutral junction, whereby isolated testing of said first, second and third windings is enabled.

2. Apparatus according to claim 1, further comprising:
   fourth, fifth and sixth air-core current transformer assemblies on said first, second and third high-voltage terminals, respectively;
   said fourth, fifth and sixth air-core current transformer assemblies being effective for producing fourth, fifth and sixth current signals responsive to current in said first, second and third high-voltage terminals respectively;
   first means for comparing said first and fourth current signals and for generating a trip signal when a percentage difference therebetween exceeds a predetemined threshold value;

second means for comparing said second and fifth current signals and for generating a trip signal when a percentage difference therebetween exceeds said predetermined threshold value; and third means for comparing said third and sixth current signals and for generating a trip signal when a percentage difference therebetween exceeds said predetermined threshold value.

3. Apparatus according to claim 1 wherein said first, second and third air-core current transformer assemblies each comprise:

an insulating bobbin;
a groove in a peripheral surface of said insulating bobbin;
an annular air-core current transformer in said groove;
said air-core current transformer including first and second windings on an insulating core; and
means for grounding one end of each of said first and second windings.

4. Apparatus according to claim 3, wherein said first and second windings are bifilar.

5. Apparatus according to claim 3 further including a metallic shield over said first and second windings, and means for grounding said metallic shield.

6. Apparatus according to claim 3 wherein said annular air-core transformer includes means for permitting an annulus thereof to be split whereby said annular air-core transformer may be installed in, and removed from, said groove without disassembly of said neutral junction.

7. Apparatus according to claim 6 wherein said means for permitting an annulus to be split includes a transverse break in said annulus generally disposed between ends of said first and second windings, an axial hole in one end of said transverse break and an axial rod extending from a second end of said transverse break, said axial rod being fittable within said axial hole whereby said transverse break is rejoined.

8. Apparatus according to claim 1 wherein said neutral junction includes an insulating layer and a grounding shield on said insulating layer, each of said air-core current transformer assemblies includes:

an annular bobbin on said grounding shield;
a groove in a peripheral surface of said bobbin;
an annular air-core current transformer in said groove; and
said air-core current transformer including at least one winding on an insulating core and a metallic shield atop said at least one winding.

9. Apparatus for a three-phase generator comprising:
a stator;
at least one winding in said stator;
a high-voltage connection ring connected to a first end of said at least one winding;
a neutral connection ring connected to a second end of said at least one winding:

a first air-core current transformer disposed to measure a current in said high-voltage connection ring;
a second air-core current transformer disposed to measure a current in said neutral connection ring; and
said first and second air-core current transformers being within said generator.

10. Apparatus for a three-phase generator comprising:
a stator;
at least one winding in said stator;
said at least one winding including first and second circuits;
a high-voltage connection ring having first and second halves;
a neutral connection ring having third and fourth halves;
means for connecting said first half to a first end of said first circuit;
means for connecting said second half to a first end of said second circuit;
means for connecting said third half to a second end of said first circuit;
means for connecting said fourth half to a second end of said second circuit;
at least first and second air-core current transformers;
first means for disposing said first air-core current transformer to measure one of a neutral current and a high-voltage current in said first circuit and for remaining unresponsive to a current in said second circuit;
second means for disposing said second air-core current transformer to measure a same one of a neutral current and a high-voltage current in said second circuit and for remaining unresponsive to current in said first circuit, whereby separate measurement of said one of a neutral current and a high-voltage current in said first and second circuits is provided; and
said first and second air-core current transformers are disposed within said three-phase generator.

11. Apparatus according to claim 10 further comprising:
third and fourth air-core current transformers;
third means for disposing said third air-core current transformer to measure the other of a neutral current and a high-voltage current in said first circuit and for remaining unresponsive to a current in said second circuit;
fourth means for disposing said fourth air-core current transformer to measure said other of a neutral current and a high-voltage current in said first circuit and for remaining unresponsive to current in said second circuit, whereby separate measurement of said neutral current and said high-voltage current at said first and second ends of said first and second circuits is provided; and
said third and fourth air-core current transformers are disposed within said three-phase generator.

* * * * *